(12) United States Patent
Abesingha

(10) Patent No.: US 11,057,023 B1
(45) Date of Patent: Jul. 6, 2021

(54) ACCURATE HIGH-VOLTAGE GATE DETECTOR

(71) Applicant: pSemi Corporation, San Diego, CA (US)

(72) Inventor: Buddhika Abesingha, Escondido, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 16/839,718

(22) Filed: Apr. 3, 2020

(51) Int. Cl.
*H03K 3/012* (2006.01)
*G01R 19/165* (2006.01)
*H03K 17/687* (2006.01)

(52) U.S. Cl.
CPC ....... *H03K 3/012* (2013.01); *G01R 19/16576* (2013.01); *G01R 19/16585* (2013.01); *H03K 17/687* (2013.01)

(58) Field of Classification Search
CPC .. H03K 3/012; H03K 17/687; H03K 17/6871; H03K 17/6874; G01R 19/16576; G01R 19/16585
See application file for complete search history.

(56) References Cited

U.S. PATENT DOCUMENTS 10,620,239 B2 * 4/2020 Tajima ................. G01R 19/165

* cited by examiner

*Primary Examiner* — Jung Kim
(74) *Attorney, Agent, or Firm* — Steinfl + Bruno LLP

(57) ABSTRACT

Systems, methods, and devices for accurate sensing of gate voltages of high-voltage devices are presented. A gate sense circuit can generate accurate transitions of the gate voltages via a differential input provided by a gate node voltage and a source node voltage of the high-voltage devices. The differential input is fed to two separate processing paths, one path for accurate detection of a rising edge of the gate voltage with a reduced propagation delay, and the other path for accurate detection of a falling edge of the gate voltage with a reduced propagation delay. A switch selects an output of the two paths that accurately detects a next edge to be detected. An Output pulse signal defined by the detected rising and falling edges is generated based on the output of the switch.

19 Claims, 9 Drawing Sheets

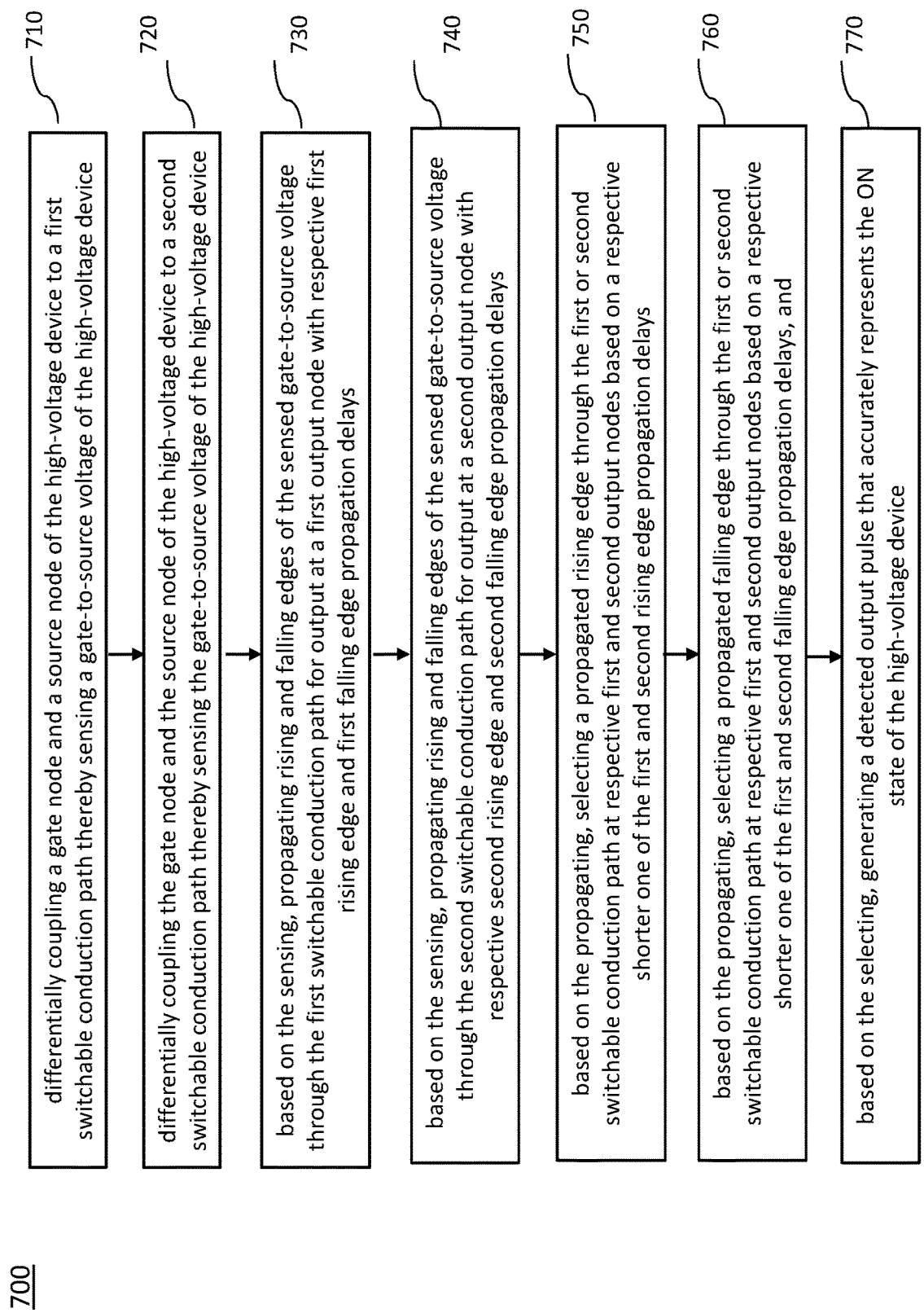

ACCURATE HIGH-VOLTAGE GATE DETECTOR

TECHNICAL FIELD

Various embodiments described herein relate generally to systems, methods, and devices for accurate sensing of gate voltages of high-voltage devices, including accurate sensing of timing corresponding to voltage transitions of such gate voltages.

BACKGROUND

Switch-mode power converters may include two or more power devices that are controlled for alternating ON/OFF states to provide current to a load. A prior art exemplary embodiment of a switch-mode (switching) power converter (100A) is shown in FIG. 1A, wherein a stack of high-voltage transistors (T1, T2) coupled between a high voltage supply, $V_{IN}$, and a reference ground, GND, is controlled to provide a current to an inductor L1, which in turn provides an output DC voltage $V_{OUT}$ based on a low pass filter formed by the inductor L1 and a shunted capacitor C 1. ON and OFF states of the high side transistor, T2, and the low side transistor, T1, are controlled via respective high side control circuit (110) comprising a level shifter (110a) and a driver (110b), and low side control circuit (120) comprising a level shifter (120a) and a driver (120b). Timing control generated by an input & timing control circuit (105) based on an input signal PWM to the power converter (100A) is used by the high side and low side control circuits (110, 120) to generate gate voltages $VG_1$ and $VG_2$ and thereby control the ON and OFF states of the transistors T1 and T2. As can be seen in FIG. 1A, the input & timing control circuit (105) may operate between a supply voltage $V_{DD1}$ (e.g., low voltage, such as about 0 to 3.5-5 V)) and a reference voltage, GND.

Because of the ON and OFF switching of the high-voltage transistors T1 and T2, a voltage at a common node, SW, of such transistors switches between the high voltage, $V_{IN}$, and the reference ground, GND. Since the node SW also defines the source node of the high side transistor, T2, it follows that the gate voltage $VG_2$ of the high side transistor "rides" the switching voltage at the common node, SW. Accordingly, as it is well known in the art, the high side control circuit (110) may operate in a "flying" high voltage domain (SW+$V_{DD2}$, SW), or in other words, a voltage domain wherein the reference voltage is the switching voltage at the common node, SW. This is shown in FIG. 1A as the high side control circuit (110) operates between a supply voltage SW+$V_{DD2}$ ($V_{DD2}$ being a low voltage, may be same as or different from $V_{DD1}$) and the switching voltage at the node SW (used as the flying/switching reference voltage). On the other hand, the low side control circuit (120) may operate between the supply voltage $V_{DD2}$ and a reference ground, GND.

As it is well known in the art, it is highly desirable to control the high side transistor T2 and the low side transistor T1 so to eliminate overlap of ON states of the two transistors during operation of the switch-mode power converter (100A), and therefore eliminate shoot-through current between the high voltage supply $V_{IN}$ and the reference ground, GND. A person skilled in the art is well aware of ill effects associated with the shoot through current, such as, for example, reduction in efficiency of the power converter (100A), potential risk of damage to the transistors (T1, T2) being driven, and potential risk of damage to a power supply generating the supply voltage $V_{IN}$ due to increased stress. Accordingly, the input & timing control circuit (105) may generate the timing control signals (e.g., HX, LX shown in FIG. 1A) so that the effective gate voltages $VG_1$ and $VG_2$ guarantee a deadtime between the ON states of the transistors T1 and T2 as shown in FIG. 1B.

As shown in FIG. 1B, a deadtime $TD_{R2}$ provides a portion of time immediately after an ON state of the low side transistor, T2, during which both transistors (T1, T2) are in their OFF states, and a deadtime $TD_{F2}$ provides a portion of time immediately after an ON state of the high side transistor during which both transistors (T1, T2) are in their OFF states. In other words, the deadtime $TD_{R2}$ defines a non-zero period of time between a falling edge $F_1$ of the gate voltage $VG_1$ and a rising edge $R_2$ of the gate voltage $VG_2$, and the deadtime $TD_{F2}$ defines a non-zero period of time between a falling edge $F_2$ of the gate voltage $VG_2$ and a rising edge $R_1$ of the gate voltage $VG_1$. As it is well known in the art, various variables such as, for example, component variations, process mismatches and varying operating condition, may affect/corrupt timing through the signal processing paths of the switch-mode power converter shown in FIG. 1A, and therefore in order to guarantee an effective deadtime (i.e., effective non-overlap of the ON states), it is typical to overcompensate the deadtime by providing deadtime amounts that are large enough to cover timing effects of all variables through the entirety of their ranges. In turn, excessive deadtime can measurably affect efficiency of the power converter (100A) as during the deadtime, current to the energized inductor L1 may be provided by current paths having larger resistances (e.g., through body diode of the transistor T1) which can therefore reduce overall efficiency of the switch-mode power converter (100A).

Based on the above, it follows that there is a need to decrease deadtime amounts to a minimum (positive) amount and as close as possible to zero. Teachings according to the present disclosure allow for accurate measurement/sensing of the gate voltages $VG_1$ and $VG_2$ within their respective voltage domains to generate timing signals representing transitions between ON and OFF states of each of the transistors T1 and T2. In turn such timing signals may be used as feedback for adaptive control of the deadtime and therefore adaptively minimize the deadtime over varying conditions and parameters.

SUMMARY

According to a first aspect of the present disclosure, a detection circuit configured to detect a gate voltage of a high-voltage device, the high-voltage device capable of withstanding a voltage higher than a first voltage ($V_{IN}$) is presented, the detection circuit comprising: a gate sense circuit that is coupled to a gate node and a source node of the high-voltage device to sense a gate-to-source voltage of the high-voltage device, the gate sense circuit comprising: a) a first conduction path for sensing a rising edge of the gate-to-source voltage to generate therefrom a rising edge of a first output signal at an output node of the first conduction path with a reduced propagation delay; and b) a second conduction path for sensing a falling edge of the gate-to-source voltage to generate therefrom a rising edge of a second output signal at an output node of the second conduction path with a reduced propagation delay; and a switch coupled to the gate sense circuit, the switch configured to selectively output: the first output signal if a next edge for sensing is the rising edge of the gate-to-source voltage, and the second output signal if the next edge for sensing is the falling edge of the gate-to-source voltage, wherein the detection circuit is configured to generate a detected output pulse based on the output of the switch.

According to a second aspect of the present disclosure, a method for accurate detection of an ON state of a high-voltage device is presented, the method comprising: differentially coupling a gate node and a source node of the high-voltage device to a first switchable conduction path thereby sensing a gate-to-source voltage of the high-voltage device; differentially coupling the gate node and the source node of the high-voltage device to a second switchable conduction path thereby sensing the gate-to-source voltage of the high-voltage device; based on the sensing, propagating rising and falling edges of the sensed gate-to-source voltage through the first switchable conduction path for output at a first output node with respective first rising edge and first falling edge propagation delays; based on the sensing, propagating rising and falling edges of the sensed gate-to-source voltage through the second switchable conduction path for output at a second output node with respective second rising edge and second falling edge propagation delays; based on the propagating, selecting a propagated rising edge through the first or second switchable conduction path at respective first and second output nodes based on a respective shorter one of the first and second rising edge propagation delays; based on the propagating, selecting a propagated falling edge through the first or second switchable conduction path at respective first and second output nodes based on a respective shorter one of the first and second falling edge propagation delays; and based on the selecting, generating a detected output pulse that accurately represents the ON state of the high-voltage device.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 7 is a process chart showing various steps of a method for accurate detection of an ON state of a high-voltage device.

DETAILED DESCRIPTION

Figure 1A:
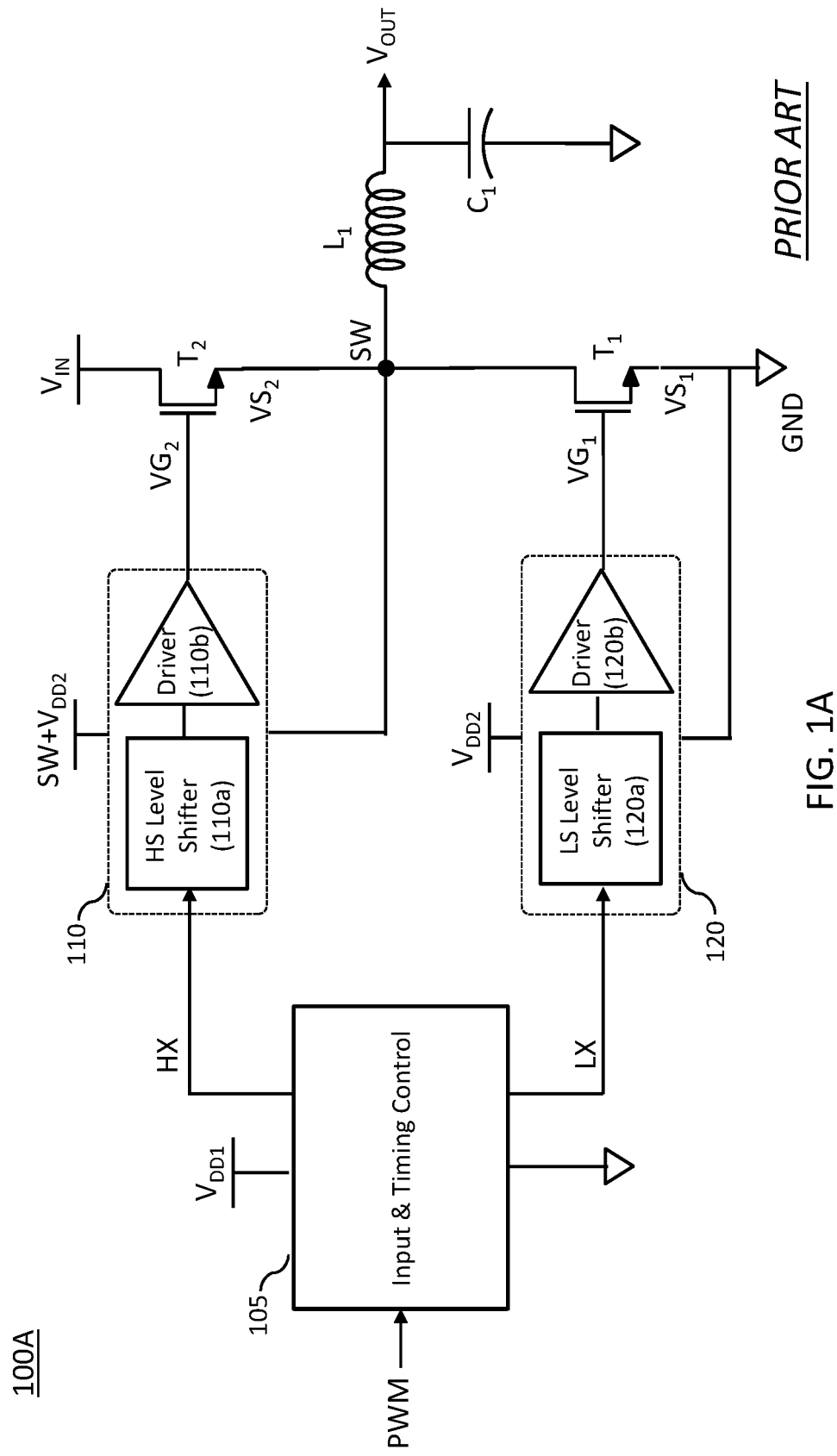
FIG. 1A shows a block diagram of a prior art switch-mode power converter including series connected high side and low side transistors.

The present disclosure describes systems, methods, and devices for accurate sensing of gate voltages of high-voltage devices, including accurate sensing of timing corresponding to voltage transitions of such gate voltages that define ON and OFF states of the high-voltage devices, such as, for example, the high side transistor T2 and the low side transistor T1 shown in FIG. 1A. The teachings according to the present disclosure sense such gate voltages via separate circuit paths, each optimized for a reduced propagation delay of one of the rising edge or the falling edge of the gate voltages. In turn, a switch selects an output of one of the two circuit paths that is optimized for a next edge to be sensed based on an output state of a latch that represents the last edge processed/detected.

A gate sense circuit according to the present disclosure can operate in high voltage domains as well as in low voltage domains. Accordingly, and with continued reference to FIG. 1A, such gate sense circuit can operate in the (flying) high voltage domain (SW+$V_{DD2}$, SW) to sense the high side gate voltage $VG_2$, as well as in the low voltage domain ($V_{DD1}$, GND) to sense the low side gate voltage $VG_1$. Irrespective of the voltage domain, the gate sense circuit according to the present disclosure can output timing information corresponding to the sensed gate voltages in the low voltage domain. In other words, outputs of the gate sense circuit according to the present disclosure are low voltage outputs (e.g., voltage amplitudes within the low voltage domain).

The low voltage outputs of the gate sense circuit according to the present disclosure may be used as feedback for adaptive control of deadtime between the ON states of the low side transistor T1 and the high side transistor T2. Because of the accurate detection of the gate voltages, and therefore of the transitions between ON and OFF states of the transistors T1 and T2, such adaptive control can achieve deadtimes very close to zero while remaining positive. Accordingly, increased power efficiencies can be achieved when implemented in the switch-mode power converter (100A) of FIG. 1A.

The gate sense circuit according to the present disclosure achieves increased accuracy (in timing/position and amplitude) by differentially sensing the gate-to-source voltage of a high-voltage transistor, such as, for example, the transistor T1 or T2 of FIG. 1A. Accordingly, the gate sense circuit according to the present disclosure considers the gate voltage and the source voltage of a high-voltage transistor as its differential input. Such differential input allows rejection (immunity to) of common-mode noise that may be generated by, for example, high voltage events (e.g., transients) due to, for example, the switching nature of the node SW of the switch-mode power converter of FIG. 1A. Accordingly, accuracy in timing between a transition from ON state to OFF state of one transistor and a transition from OFF state to ON state of the other transistor can be achieved.

The gate sense circuit according to the present disclosure achieves increased processing speed (i.e., reduced delay) by using two separate circuit paths for sensing each of a positive transition (i.e., rising edge, OFF state to ON state) and a negative transition (i.e., falling edge, ON state to OFF state) of the differential input (e.g., gate-to-source voltage). Each of the two separate circuit paths is being optimized to process one of the rising edge or the falling edge of the differential input with a reduced propagation delay; in other words, one of the circuit paths processes the rising edge with a reduced propagation delay (e.g., faster propagation) and the other circuit path processes the falling edge with a reduced propagation delay (e.g., faster propagation). In turn, each of a rising edge and a falling edge of a detected output pulse signal representative of an ON state (and therefore OFF state) of the high side transistor (e.g., T2) or low side transistor (e.g., T1) is generated using an edge sensed/detected by the circuit path that is optimized for processing of that edge with reduced propagation delay. For example, i) the first circuit path can be activated based on the rising edge of the differential input, to generate therefrom with a reduced propagation delay, a rising edge of a first output signal at an output node of the first circuit path; ii) the second circuit path can be activated based on the falling edge of the differential input, to generate therefrom with a reduced propagation delay, a rising edge of a second output signal at an output node of the second circuit path; iii) a rising edge of the detected output signal is defined/generated by the rising edge of the first signal and is independent from the second signal; and iv) a falling edge of the detected output signal is defined/generated by the rising edge of the second signal and is independent from the first signal. As will be described later, activation of each of the first and the second separate circuit paths may be based on turning ON of a corresponding transistor that is coupled to the gate node and the source node of the high-voltage device (e.g., T1 or T2). In other words, activation is based on a differential input signal. Furthermore, because current conduction through the differential input of each of the separate circuit paths is based on such turning ON, each such path can be referred to as a switchable conduction path, or a switchable path.

Each of the separate circuit paths of the gate sense circuit may include a switching transistor that is biased to turn ON responsive to one of the two transitions (positive or negative), and a level shift circuit that translates a high voltage to a low voltage. According to an exemplary embodiment of the present disclosure, such level shift circuit may include a high-voltage transistor that is capable to withstand a voltage that is higher than a high voltage (e.g. higher than $V_{IN}+V_{DD2}$ shown in FIG. 1A) of the flying high voltage domain.

According to another exemplary embodiment of the present disclosure, each of the two separate circuit paths may include a pull-down circuit that pulls down an output node of each of the circuit paths when a corresponding switching transistor is not turned ON (e.g., activated). In other words, when one of the paths is activated (switching transistor is ON and therefore current flows through the path), a corresponding output node is charged to provide a (positive) transition at the output node that corresponds to a transition at the input of the circuit path that turned the switching transistor ON, and when the path is not activated (switching transistor is OFF and therefore no current flows through the path), a pull-down circuit sets (e.g., resets to, for example, zero volts) a voltage level at the output node.

According to an exemplary embodiment of the present disclosure, the pull-down circuit is activated via the other one of the two transitions. In other words, an activated circuit path is used to pull down an output of the deactivated circuit path. According to an exemplary embodiment of the present disclosure, the pull-down circuit can be a cross coupled latch comprising two cross coupled transistors between the two separate circuit paths.

According to an exemplary embodiment of the present disclosure, outputs of the two separate circuit paths can be combined via a switch that selectively outputs one of the outputs to be fed to a latch. The output state of the latch, which determines the next edge to be sensed, can be used to control the switch to select an output from one of the two circuit paths that is optimized to process the next edge. For example, i) the output state of the latch controls the switch to select an output corresponding to a sensed rising edge of a differential input (e.g., gate-to-source voltage) to the gate sense circuit as processed by one of the two circuit paths optimized for the rising edge; ii) the selected output is fed to the latch and causes the latch to change state; and iii) the new output state of the latch controls the switch to select an output corresponding to a sensed falling edge as processed by the other path of the two circuit paths optimized for the falling edge, etc. In other words, the switch according to the present teachings allows the faster of the two outputs to be selected, based on whether sensing the rising edge or falling edge of the differential input (as established by the output state of the latch). For example, if the switch is set to select the output from the circuit path that is optimized to process the rising edge, then once the rising edge occurs, the latch is set to the proper state, and then the switch is configured to select the output from the circuit path that is optimized to process the falling edge, which as described above, is the faster path (reduced propagation delay) through the gate sense circuit for falling edge.

Figure 2:
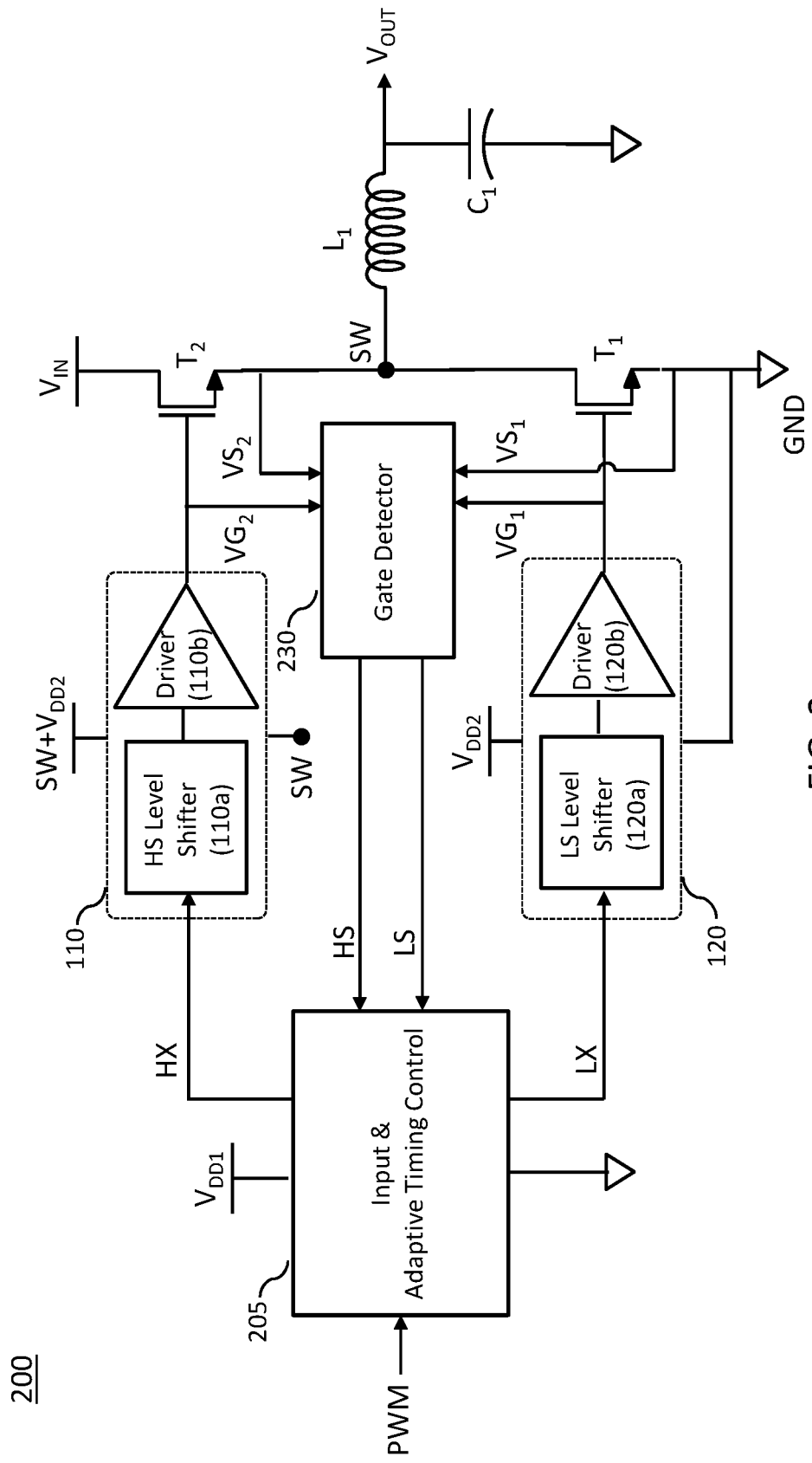
FIG. 2 shows a block diagram of a switch-mode power converter according to an embodiment of the present disclosure, wherein deadtime is adaptively controlled via feedback provided by an accurate high-voltage gate detector circuit.

FIG. 2 shows a block diagram of a switch-mode power converter (200) according to an embodiment of the present disclosure, wherein deadtime can be adaptively controlled via feedback (HS, LS) provided by an accurate high-voltage gate detector (HVGD) circuit (230). As can be seen in FIG. 2, the HVGD circuit (230) according to the present teachings is coupled to each of the low side transistor T1 and the high side transistor T2 via respective gate and source voltages ($VG_1$, $VS_1$) and ($VG_2$, $VS_2$). Such inputs allow for increased accuracy in sensing (e.g., via a gate sense circuit) of timing and amplitude by differentially sensing the respective gate-to-source voltages ($VG_1$–$VS_1$) and ($VG_2$–$VS_2$) used to generate the outputs (LS, HS) used as feedback.

With continued reference to FIG. 2, the gate detector (230) can operate over the flying high voltage domain (SW+$V_{DD2}$, SW) to sense gate-to-source voltage of the high side transistor T2, and over the lower voltage domain ($V_{DD2}$, GND) to sense gate-to-source voltage of the low side transistor T1. Furthermore, the outputs (LS, HS) of the gate detector (230) are configured to operate within the lower voltage domain ($V_{DD1}$, GND) within which the block (205) operates. Accordingly, although not shown in FIG. 2 for clarity purposes, all voltages and references corresponding to said three voltage domains are also provided to the gate detector (230).

Figure 1B:
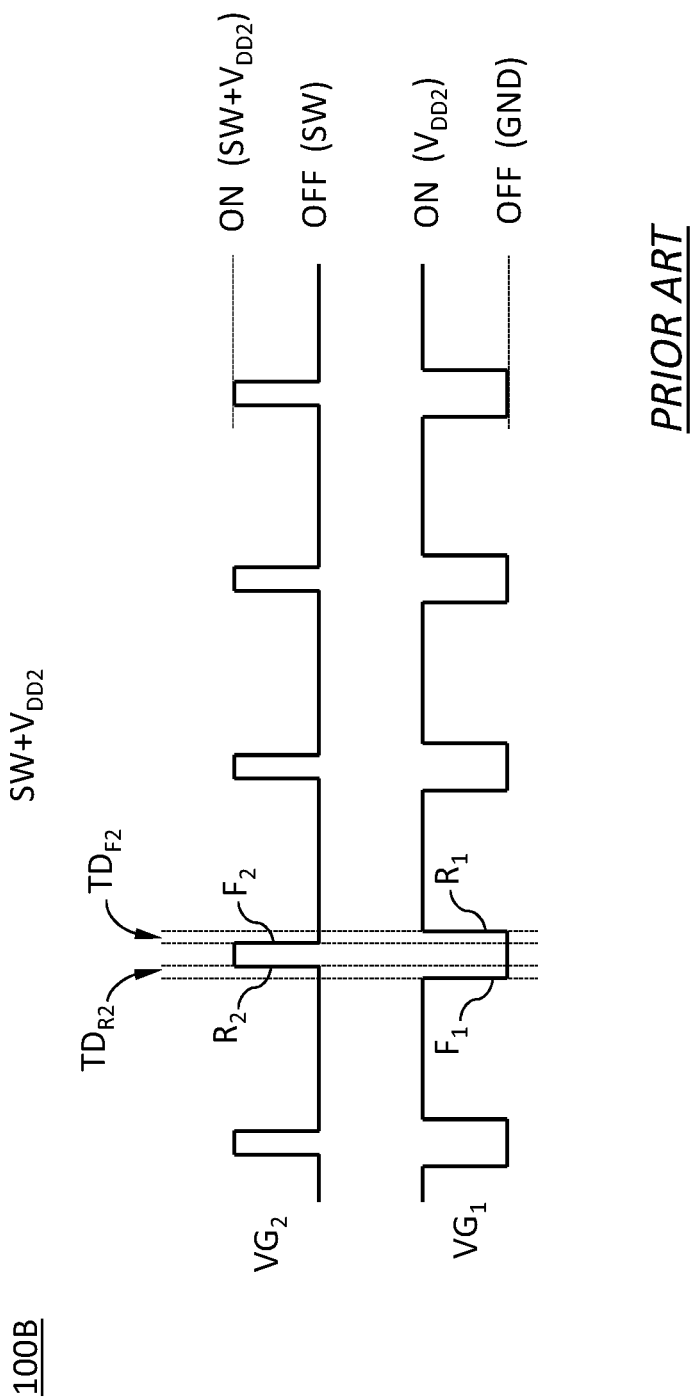
FIG. 1B shows a timing diagram representative of deadtimes between ON states of the high side and low side transistors.

As can be seen in FIG. 2, outputs (HS, LS) from the gate detector (230) are provided as feedback to the input & adaptive timing control circuit (205) which can be configured to generate the timing control signals (HX, LX) by considering the feedback as control to reduce deadtime between ON states of the transistors T1 and T2. Because of the accuracy in detection by the gate detector (230) of the effective transitions between states for each of the transistors T1 and T2, the outputs (HS, LS) can be used to adaptively reduce deadtime between the ON states to values that are very close to zero while remaining positive. Prior art circuits, such as for example, delay locked loops (DLLs, similar to PLLs but operating on delays instead of phases) can be used within the circuit block (205) to gradually (step wise) reduce the deadtime provided in the timing control signals (HX, LX) to a minimum value. In some implementations a separate DLL circuit can be used to control each of the two deadtimes ($TD_{R2}$, $TD_{F2}$) shown in FIG. 1B, for example, by fixing a delay of rising and falling edges ($R_2$, $F_2$) corresponding to the high side transistor T2 with respect to edges of the input signal, PWM, and correcting timing positions of the rising and falling edges ($F_1$, $R_1$) corresponding to the low side transistor T1 based on the feedback (LS, HS). It should be noted that design and implementation details of the circuit block (205) shown in FIG. 2 are outside the scope of the present disclosure.

Figure 3A:
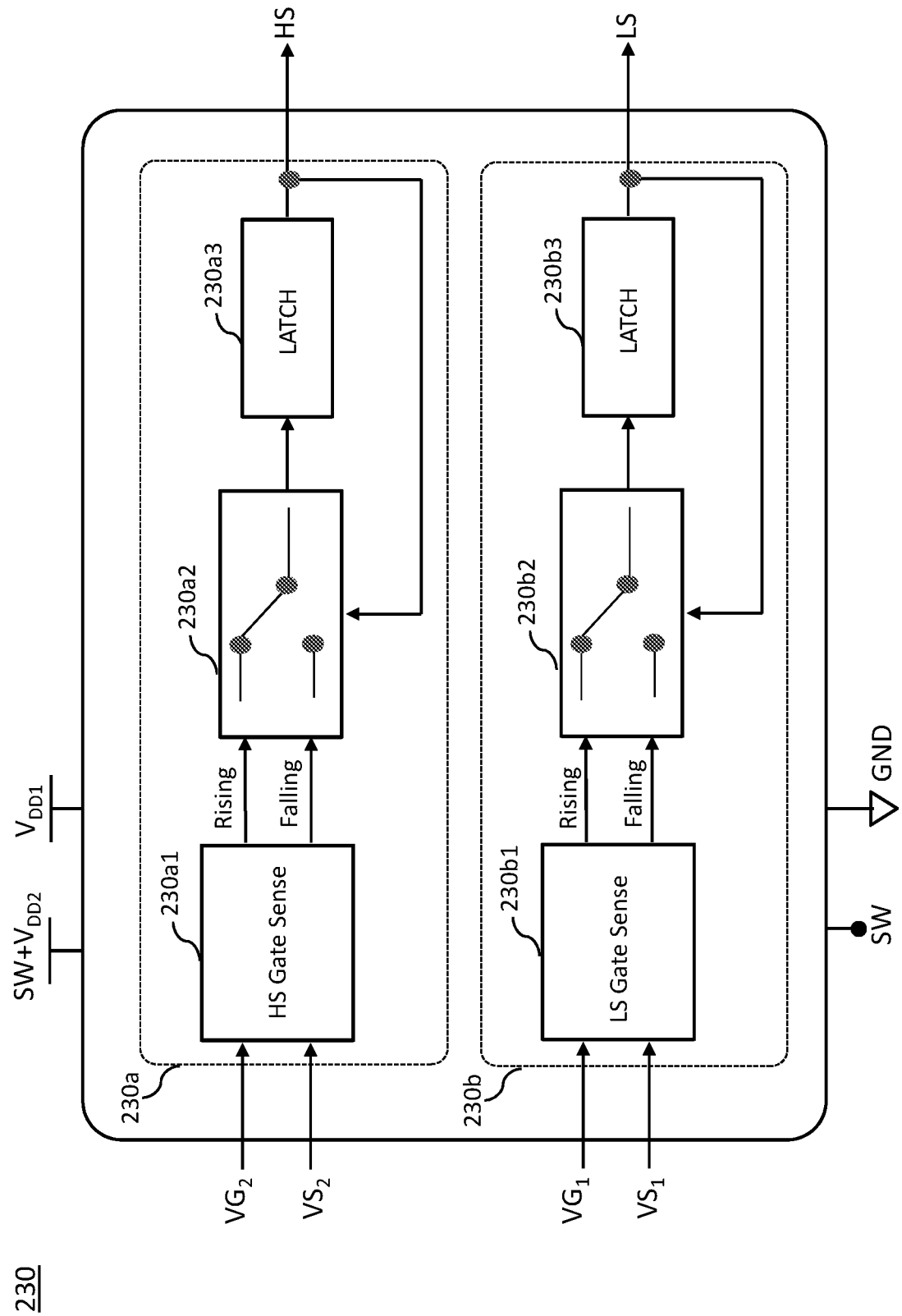
FIG. 3A shows a block diagram of an accurate high-voltage gate detector circuit according to an embodiment of the present disclosure.

FIG. 3A shows a block diagram of an accurate high-voltage gate detector (HVGD) circuit (230) according to an embodiment of the present disclosure that can be used in the switch-mode power converter (200) of FIG. 2. As can be seen in FIG. 3A, the HVGD circuit (230) comprises two separate HVGD circuits (230a) and (230b), each coupled to a respective differential input ($VG_2$, $VS_2$) and ($VG_1$, $VS_1$) for differentially sensing a respective gate-to-source voltage ($VG_2$–$VS_2$) and ($VG_1$–$VS_1$), and output respective outputs HS and LS which as described above may be used as feedback to the circuit block (205) of FIG. 2.

With continued reference to FIG. 3A, according to an exemplary embodiment of the present disclosure, the two HVGD circuits (230a) and (230b) are similar in design and layout so to provide a substantially equal propagation delay through the two circuits. Accordingly, each of the circuit blocks (230a1, 230a2, 230a3) of the HVGD circuit (230a) provide substantially equal propagation delay as a corresponding circuit block (230b1, 230b2, 230b3) of the HVGD circuit (230b).

With further reference to FIG. 3A, each of the two HVGD circuits (230a, 230b) include a respective gate sense circuit (230a1, 230b1) that is coupled to a respective differential input ($VG_2$, $VS_2$) and ($VG_1$, $VS_1$), each such gate sense circuit outputting a Rising signal and a Falling signal respectively corresponding to an OFF state to ON state transition and an ON state to OFF state transition of a corresponding high-voltage transistor (e.g., T1 or T2). The (Rising, Falling) signals are provided to different throws of a respective switch (230a2, 230b2) which selectively outputs one of the two signals (Rising, Falling) to a respective latch (230a3, 230b3). In turn, as can be seen in FIG. 3A, the output of the respective latch (230a3, 230b3) provides the output signals (HS, LS). It should be noted that the switch (230a2, 230b2) may be a multiplexer circuit which as known to a person skilled in the art can perform the functionality of a switch. Similarly, a person skilled in the art may know of many circuit designs to implement the functionality of the latch (230a3, 230b3).

As shown in FIG. 3A, the output of the latch (230a3, 230b3) controls a respective one of the switches (230a2, 230b2). In other words, selection of one of the two signals (Rising, Falling) for output at a common terminal of the respective switch (230a2, 230b2) is based on a state of the respective output signal (HS, LS). For example, if the HS signal is high to indicate an ON state of the high side transistor T2, then such high state of the HS signal may control the switch (230a2) to output the Falling signal, so that any subsequent transition in the Falling signal may trigger the latch (230a3) to change (flip) state. On the other hand, if the HS signal is low to indicate an OFF state of the high side transistor T2, then such low state of the HS signal may control the switch (230a2) to output the Rising signal, so that any subsequent transition in the Rising signal may trigger the latch (230a3) to change (flip) state. This is shown in the timing diagram of FIG. 3B.

Figure 3B:
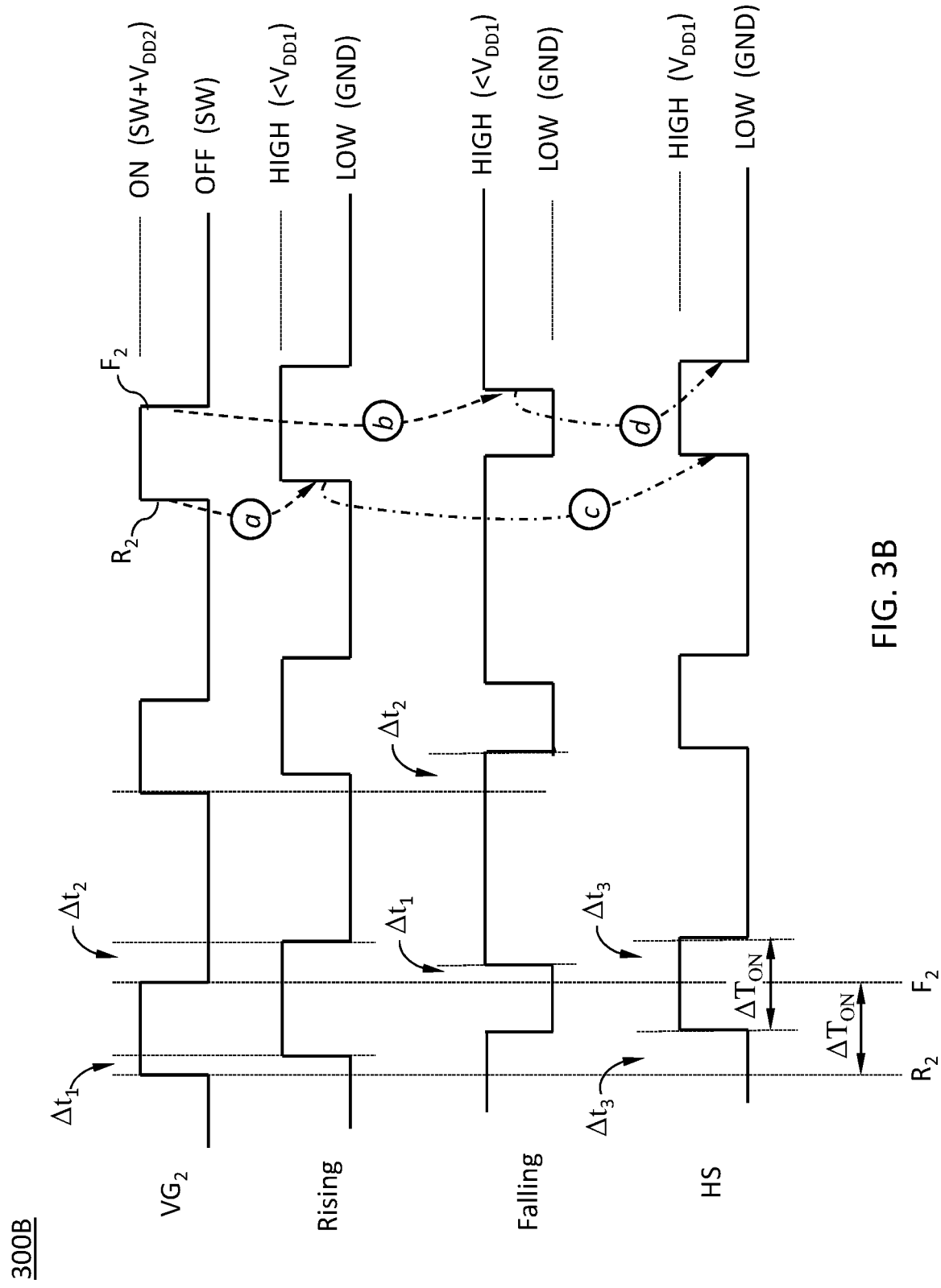
FIG. 3B shows a timing diagram representative of various signal processing steps performed by the high-voltage gate detector circuit of FIG. 3A.

As indicated via a signal flow detail a in FIG. 3B, the Rising signal that is generated by the HS gate sense circuit (230a1) has a rising edge that is triggered by an OFF state to ON state transition (i.e., labelled as $R_2$) of the gate voltage $VG_2$ (when differentially sensed) and delayed by a propagation delay $\Delta t_1$ through the HS gate sense circuit (230a1). Similarly, as indicated via a signal flow detail b in FIG. 3B, the Falling signal that is generated by the HS gate sense circuit (230a1) has a rising edge that is triggered by an ON state to OFF state transition (i.e., labelled as $F_2$) of the gate voltage $VG_2$ (when differentially sensed) and delayed by a propagation delay $\Delta t_1$ through the HS gate sense circuit (230a1). It should be noted that as shown in FIG. 3B, falling edges of the Rising and Falling signals are subjected to a longer propagation delay $\Delta t_2$ through the HS gate sense circuit (230a1). As described above, this is due to the pull down of an output node of the HS gate sense circuit (230a1) which provides for an increased delay. It should be noted that such increased delay is a reason why such falling edges are not used to generate the falling edges of the output signals HS and LS.

With continued reference to FIG. 3B, as indicated by the signal flow detail c in FIG. 3B, the rising edge of the output signal HS of the HVGD circuit (230a) is triggered by the rising edge of the Rising signal and the falling edge of the output signal HS of the HVGD circuit (230a) is triggered by the rising edge of the Falling signal. Considering for example the triggering of the rising edge of the output signal HS, as shown in the timing diagram of FIG. 3B: at an instant prior to the triggering, and therefore prior to the rising edge of the Rising signal, the output signal HS is in a low state (i.e., OFF state of transistor T2), and therefore the latch (230a3) shown in FIG. 3A controls the switch (230a2) to output the Rising signal indicative of a change of state from OFF state to ON state. Accordingly, the next edge seen by the latch (230a3) is the rising edge of the Rising signal which flips output state of the latch (and therefore of the HS signal per FIG. 3B). Similar description can be made with respect to the triggering of the falling edge of the HS signal, wherein at an instant prior to the triggering, the output signal HS is in high state and therefore the latch (230a3) controls the switch (230a2) to output the Falling signal.

With further reference to FIG. 3B, because the latch (230a3) triggers (changes states) based on a same polarity input signal (rising edges), a propagation delay through the latch is equal, and therefore, as shown in FIG. 3B, a pulse length $\Delta T_{ON}$ of the HS signal is equal to a pulse length of the gate voltage $VG_2$ (when differentially sensed). This is due to a substantially same propagation delay $\Delta t_3$ applied to each of the rising and falling edges of the HS signal with respect to the falling and rising edges of $VG_2$. It should be noted that the propagation delay through the latch (230a3) plays a very minimal role in setting equal rising/falling propagation delay and thereby setting of equal pulse lengths of the HS signal and the gate voltage $VG_2$. Rather, a main contributor to setting equal propagation delays is the switch (230a2) which selects the faster output (least propagation delay) of the gate sense circuit (230a1). The gate sense circuit (230a1) according to the present teachings is designed to provide two outputs: a first output (labeled Rising in FIG. 3A) which always provides the fastest propagation for a rising edge; and a second output (labeled Falling in FIG. 3A) which always provides the fastest propagation for a falling edge. By choosing and "listening" for the fastest output, the propagation delays between rising and falling edges are made substantially equal, achieving the same $\Delta T_{ON}$ for the HS signal and the gate voltage $VG_2$ as shown in FIG. 3B.

Figure 4:
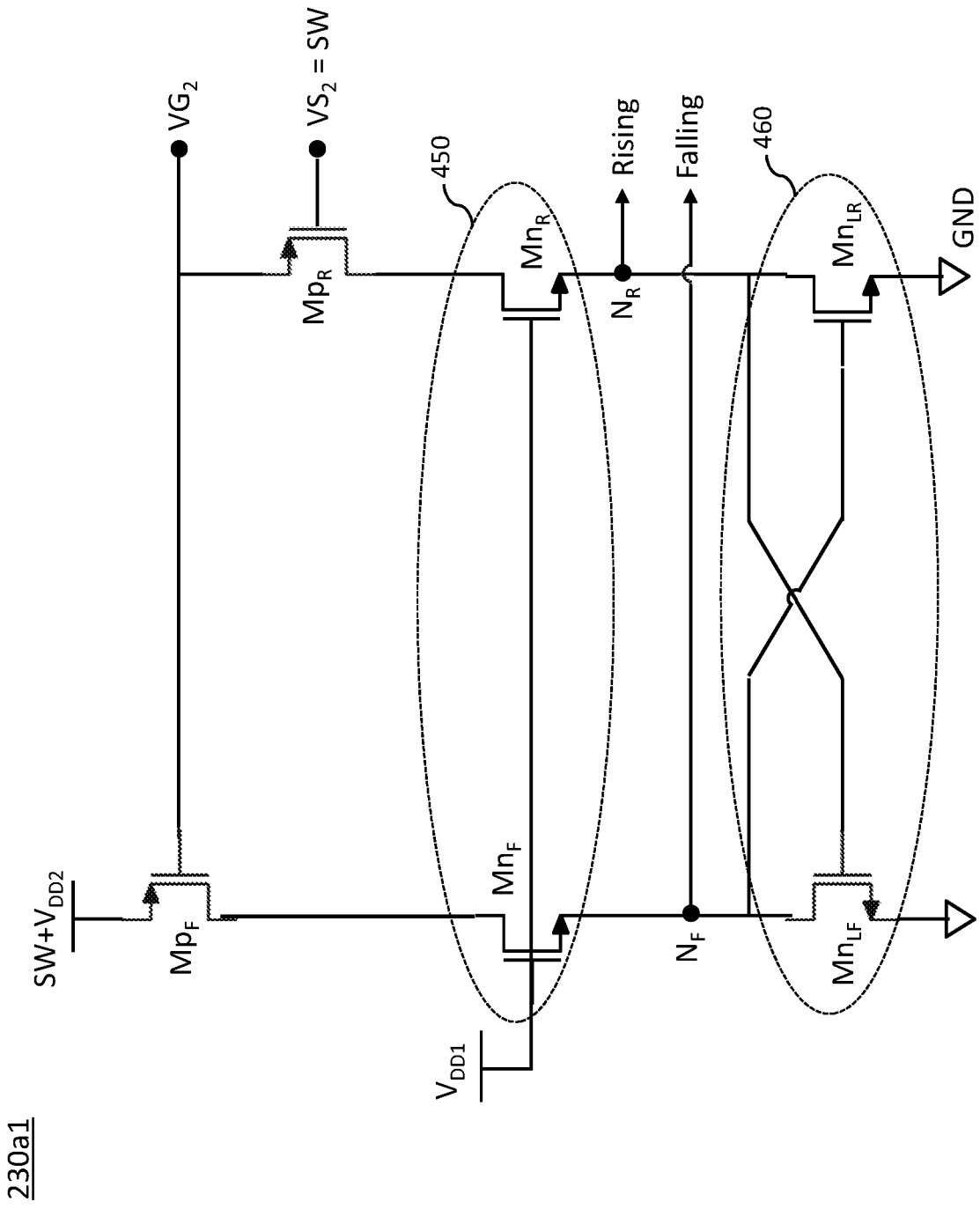
FIG. 4 shows a high-voltage gate sense circuit according to an embodiment of the present disclosure.

Details of the gate sense circuit (230a1 of FIG. 3A) are shown in FIG. 4. As described above, the gate sense circuit according to the present disclosure includes two separate circuit paths: a fast rising circuit path ($Mp_R$, $Mn_R$, $MN_{LR}$) for generating, based on differential inputs ($VG_2$, $VS_2$), accurately and with reduced propagation delay the rising edge of the Rising signal at a node $N_R$; and a fast falling circuit path ($Mp_F$, $Mn_F$, $MN_{LF}$) for generating, based on differential inputs ($VG_2$, $VS_2$), accurately and with reduced propagation delay the rising edge of the Falling signal at a node $N_F$.

The gate sense circuit according to the present disclosure generates the rising edge of the Rising signal based on a time when the gate-to-source voltage becomes positive (e.g., $VG_2-VS_2>0$), and generates the rising edge of the Falling signal based on a time when the gate-to-source voltage becomes smaller than a high supply voltage level (e.g., $VG_2-VS_2<V_{DD2}$). It should be noted that although FIG. 4 shows details of the gate sense circuit (230a1) for sensing gate-to-source voltage of the high side transistor T2, same circuit may be used for sensing gate-to-source voltage of the low side transistor T1. In other words, as described above, sensing of the gate-to-source voltages of the high side transistor T2 and low side transistor T1 is performed via circuits similar to one showed in FIG. 4.

With respect to the fast rising circuit path ($Mp_R$, $Mn_R$, $MN_{LR}$) of FIG. 4, such path includes a PMOS switching transistor $Mp_R$ that is configured to conduct (turn ON) when $VG_2$, that is coupled to a source node of the switching transistor $Mp_R$, is larger than $VS_2$, that is coupled to a gate node of the switching transistor $Mp_R$, In other words, the switching transistor $Mp_R$ turn ON when the gate-to-source voltage (e.g., $VG_2-VS_2$) is positive. When the switching transistor $Mp_R$ conducts (the fast rising circuit path is activated, active, ON), the drain node of the high-voltage stand-off transistor $Mn_R$, that is coupled to the drain node of the switching transistor $Mp_R$, sees a high voltage that is higher than $V_{DD1}$ coupled to a gate node of the high-voltage stand-off transistor $Mn_R$. Accordingly, the high-voltage stand-off transistor $Mn_R$ turns ON to generate the rising edge of the Rising signal at node $N_R$. It should be noted that when the high-voltage stand-off transistor $Mn_R$ is ON, a voltage level at the node $N_R$ may be smaller than the voltage $V_{DD1}$ and equal to $V_{DD1}-V_{TH}$, wherein $V_{TH}$ represents the threshold voltage of the high-voltage transistor $Mn_R$.

With continued reference to FIG. 4, when the switching transistor $Mp_R$ does not conduct (the fast rising circuit path is deactivated, inactive, OFF), no current flows through such transistor. This happens when the gate-to-source voltage starts dropping from a voltage level (e.g., $V_{DD2}$) representative of an ON state of the high-voltage transistor (e.g., T2). In this case, the switching transistor $Mp_F$ of the fast falling circuit path ($Mp_F$, $Mn_F$, $MN_{LF}$) conducts under the condition $VG_2-VS_2<V_{DD2}$). With $VG_2$ coupled to a gate node of the switching transistor $Mp_F$ and ($SW+V_{DD2}$) coupled to a source node of the switching transistor $Mp_F$, the switching transistor $Mp_F$ conducts when ($SW+V_{DD2}$)>$VG_2$, or in other terms, since $SW=VS_2$, when $VG_2-VS2<V_{DD2}$. In turn a high-voltage stand-off transistor $Mn_F$ turns ON to generate the rising edge of the Falling signal at node $N_F$. At the same time, node $N_F$ drives the pull-down transistor $Mn_{LR}$ of the now deactivated fast rising circuit path ($Mp_R$, $Mn_R$, $MN_{LR}$) to pull down the voltage at the node $N_R$.

Figure 5:
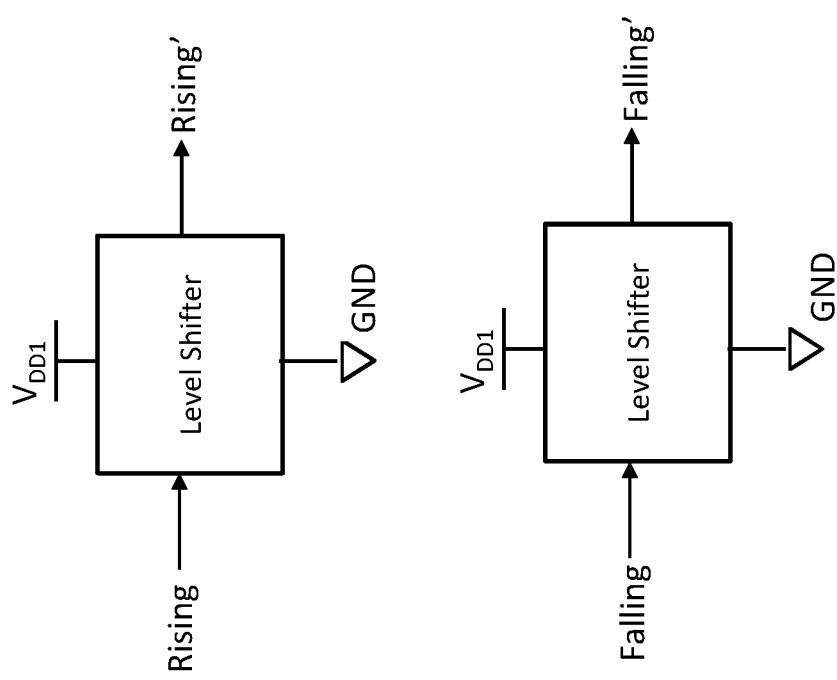
FIG. 5 shows circuits for level shifting.

As described above, high voltage levels at the nodes $N_R$ and $N_F$ of the gate sense circuit of FIG. 4 may be below the operating supply voltage $V_{DD1}$ of the input & adaptive timing control circuit (205) shown in FIG. 2. Accordingly, such voltage levels may be restored/shifted/reconstructed via a level shifter as shown in FIG. 5. Various design implementations for such level shifter are well known in the art and beyond the scope of the present disclosure. A simple level shifter may include a basic logic gate operating at a target voltage level (e.g., $V_{DD1}$).

Figure 6:
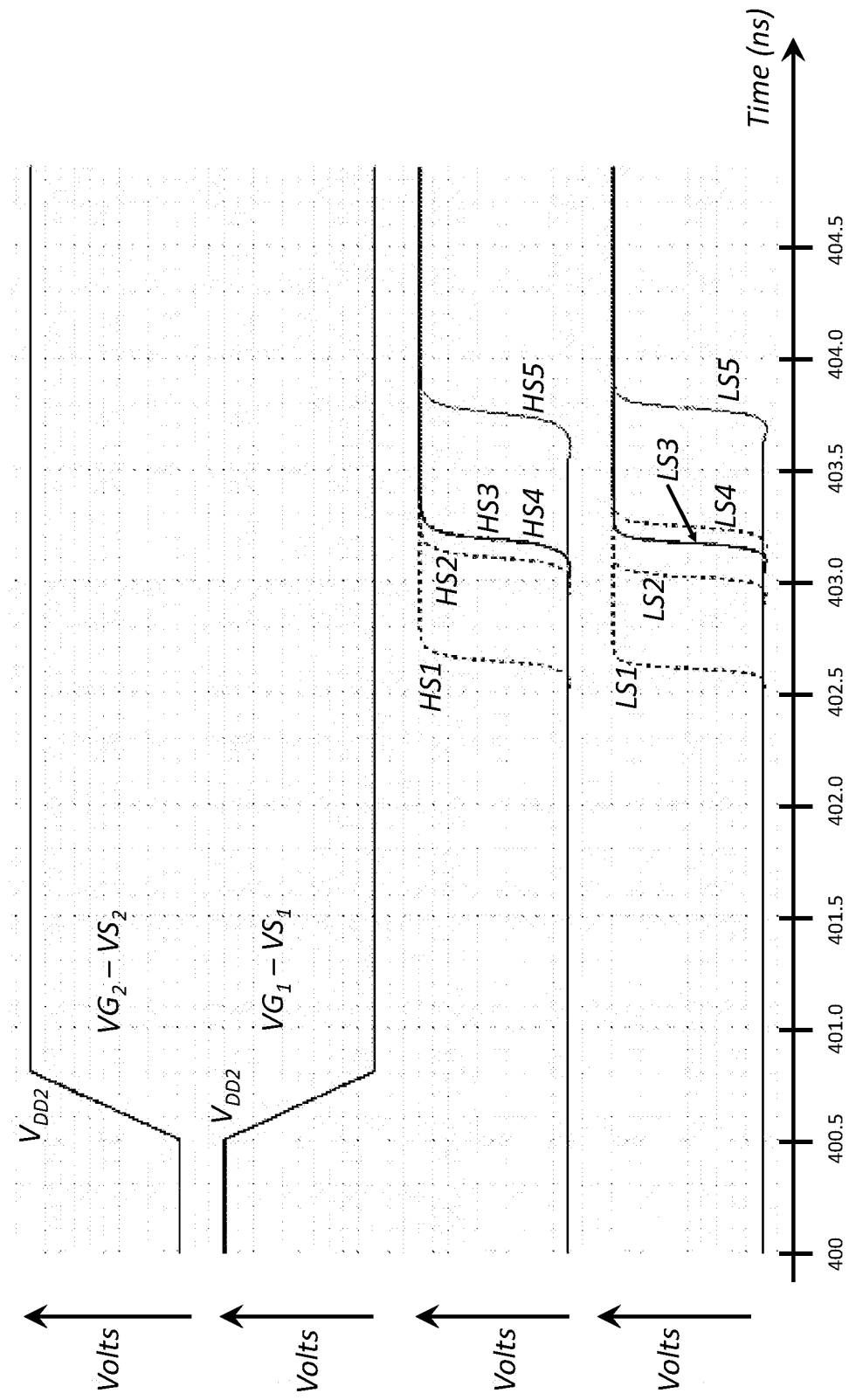
FIG. 6 shows a timing diagram representative of high side output and low side output of the high-voltage gate detector circuit of FIG. 3A for different low side and high side transistors.

FIG. 6 shows a timing diagram representative of high side output, HS, and low side output, LS, of the high-voltage gate detector circuit (230) of FIG. 3A for different characteristics of the internal transistors of the IC technology used to fabricate and realize the gate detector (230), wherein such characteristics may represent five corners for internal MOS transistors: typical, fast, slow, fast-NMOS/slow-PMOS, slow-NMOS/fast-PMOS. As can be seen in FIG. 6, irrespective of such characteristics, a transition representative of a turn ON condition (e.g., $VG_2-VS_2>0$) of the high side transistor, T2, that is aligned with a transition representative of a turn OFF condition (e.g., $VG_1-VS_1<V_{DD2}$) of the low side transistor, T1, are detected by the respective gate detector circuit and represented by transitions (HS1, HS2, HS3, HS4, HS5) and (LS1, LS2, LS3, LS4, LS5) that are substantially aligned (to be noted that transitions HS3 and HS4 shown in FIG. 6 overlap one another). Applicant of the present disclosure has measured a worst-case error in (transition) alignment of the high side versus the low side detection of less than 0.12 ns. In other words, for perfectly aligned transitions of the high side and the low side transistors, any two pairs (HS1, LS1), (HS2, LS2), (HS3, LS3), (HS4, LS4) and (HS5, LS5) have transition edges that are aligned within a 0.12 ns. Accordingly, a minimum deadtime achievable by the switch-mode power converter shown in FIG. 3A can be as low as 0.12 ns and no less than 0.24 ns.

As used in the present disclosure, a low voltage device or low voltage transistor refers to a semiconductor transistor device with a low breakdown voltage which can withstand and block (e.g. in the OFF state) DC voltages (e.g. typically applied between the source and drain terminals of the transistor, or any two of drain, source and gate terminals) less than 10 volts and more typically substantially less than 10 volts, such as less than 3.3-5 volts. Some exemplary low voltage devices are complementary metal-oxide-semiconductor (CMOS) transistors.

As used in the present disclosure, a high-voltage device or high-voltage transistor refers to a semiconductor transistor device which can withstand and block (e.g. in the OFF state) DC voltages (typically applied between the source and drain terminals of the transistor, or any two of drain, source and gate terminals) greater than 5-10 volts, and more typically substantially greater than 5-10 volts, such as greater than 12-100 volts. Some exemplary high-voltage devices are depletion mode GaN transistors (d-GaN), enhancement mode GaN transistors (e-GaN), stacked MOS transistors, and other high-voltage transistors known to a person skilled in the art, such as Si MOSFETs, hexagonal shape FETs (HEXFETs), LDMOS, indium phosphide (InP), etc. which can also be enhancement or depletion modes (e.g. e-type or d-type) and N or P polarity.

Exemplary high-voltage devices that can be used as the high side and low side transistors described in the present disclosure may be e-GaN FET transistors. However, such exemplary usage should not be construed as limiting the scope of the invention as disclosed herewith. Unless explicitly mentioned as d-GaN, the terms GaN and e-GaN are considered synonymous herein.

A person skilled in the art can recognize that depletion mode d-GaN devices or other types of high-voltage transistors such as Si MOSFETs, HEXFETs, LDMOS, InP (and all these examples can be of the e-type or d-type; and N or P polarity) or virtually any device capable of switching ON or OFF with high voltages applied can be controlled using the teachings of the present disclosure. A person skilled in the art would know that specific design considerations in view of a desire to control a specific type of a high-voltage transistor may also be needed, description of which is beyond the scope of the present disclosure.

E-GaN devices have typical threshold, or turn-on, voltages of approximately +0.7 to +3 volts of gate-to-source voltage. Such devices are typically capable of withstanding 5 to 200 volts of drain-to-source, $V_{DS}$, voltage, thereby enabling high voltage applications, such as, for example, DC/DC power conversion from a high input voltage to a low output voltage. GaN transistors are used in the present disclosure as an exemplary approach to high voltage power management due to the known advantageous characteristics of GaN transistors, such as, for example, a low FOM.

FIG. 7 is a process chart (700) showing various steps of a method for accurate detection of an ON state of a high-voltage device. As can be seen in FIG. 7, such steps comprise: differentially coupling a gate node and a source node of the high-voltage device to a first switchable conduction path thereby sensing a gate-to-source voltage of the high-voltage device, per step (710); differentially coupling the gate node and the source node of the high-voltage device to a second switchable conduction path thereby sensing the gate-to-source voltage of the high-voltage device, per step (720); based on the sensing, propagating rising and falling edges of the sensed gate-to-source voltage through the first switchable conduction path for output at a first output node with respective first rising edge and first falling edge propagation delays, per step (730); based on the sensing, propagating rising and falling edges of the sensed gate-to-source voltage through the second switchable conduction path for output at a second output node with respective second rising edge and second falling edge propagation delays, per step (740); based on the propagating, selecting a propagated rising edge through the first or second switchable conduction path at respective first and second output nodes based on a respective shorter one of the first and second rising edge propagation delays, per step (750); based on the propagating, selecting a propagated falling edge through the first or second switchable conduction path at respective first and second output nodes based on a respective shorter one of the first and second falling edge propagation delays, per step (760); and based on the selecting, generating a detected output pulse that accurately represents the ON state of the high-voltage device, per step (770).

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with a high-voltage BCD process or an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functions without significantly altering the functionality of the disclosed circuits.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A detection circuit configured to detect a gate voltage of a high-voltage device, the high-voltage device capable of withstanding a voltage higher than a first voltage ($V_{IN}$), the detection circuit comprising:
    a gate sense circuit that is coupled to a gate node and a source node of the high-voltage device to sense a gate-to-source voltage of the high-voltage device, the gate sense circuit comprising:
        a) a first conduction path for sensing a rising edge of the gate-to-source voltage to generate therefrom a rising edge of a first output signal at an output node of the first conduction path with a reduced propagation delay; and
        b) a second conduction path for sensing a falling edge of the gate-to-source voltage to generate therefrom a rising edge of a second output signal at an output node of the second conduction path with a reduced propagation delay; and
    a switch coupled to the gate sense circuit, the switch configured to selectively output:
    the first output signal if a next edge for sensing is the rising edge of the gate-to-source voltage, and
    the second output signal if the next edge for sensing is the falling edge of the gate-to-source voltage,
    wherein
    the detection circuit is configured to generate a detected output pulse based on the output of the switch.

2. The detection circuit of claim 1, wherein:
    a propagation delay of a sensed rising edge of the gate-to-source voltage through the first conduction path is reduced compared to a propagation delay of a sensed rising edge of the gate-to-source voltage through the second conduction path, and
    a propagation delay of a sensed falling edge of the gate-to-source voltage through the second conduction path is reduced compared to a propagation delay of a sensed falling edge of the gate-to-source voltage through the first conduction path.

3. The detection circuit of claim 1, wherein:
    the first conduction path that is activated during a rising edge transition of the gate-to-source voltage from zero volts to a second voltage ($V_{DD2}$) that is smaller than the first voltage; and
    the second conduction path that is activated during a falling edge transition of the gate-to-source voltage from the second voltage to zero volts.

4. The detection circuit of claim 3, wherein
    the first conduction path remains active while the gate-to-source voltage is substantially equal to the second voltage, and
    the second conduction path remains active while the gate-to-source voltage is equal to zero volts.

5. The detection circuit of claim 1, wherein:
    the first conduction path and the second conduction path respectively comprise a first PMOS transistor and a second PMOS transistor,
    activation of the first conduction path is based on turning ON of a first PMOS transistor of the first conduction path; and
    activation of the second conduction path is based on turning ON of a second PMOS transistor of the second conduction path.

6. The detection circuit of claim 5, wherein
    the first PMOS transistor comprises:
        a gate node coupled to the source node of the high-voltage device; and
        a source node coupled to the gate node of the high-voltage device, and
    the second PMOS transistor comprises:
        a gate node coupled to the gate node of the high-voltage device; and
        a source node coupled to a node that is at an offset voltage equal to the second voltage above the source node of the high-voltage device.

7. The detection circuit of claim 1, wherein each of the first and second conduction paths further comprises:
    a high-voltage stand-off NMOS transistor having:
        a drain node coupled to a drain node of a respective one of the first and second PMOS transistors;
        a gate node coupled to a third voltage ($V_{DD1}$) that is smaller than the first voltage; and
        a source node coupled to a respective output node of the first and the second conduction paths.

8. The detection circuit of claim 7, wherein the high-voltage stand-off NMOS transistor is configured to level shift a high voltage substantially equal to the first voltage at the drain node of said transistor to a low voltage substantially equal to the third voltage at the source node of said transistor.

9. The detection circuit of claim 8, wherein the first voltage is equal to or higher than 10 volts, the second voltage is equal to or lower than 5 volts, and the third voltage is equal to, or lower than, 5 volts.

10. The detection circuit of claim 9, wherein the second voltage is equal to the third voltage.

11. The detection circuit of claim 1, wherein the switch is a multiplexer having a first input coupled to the output node of the first conduction path and a second input coupled to the output node of the second conduction path.

12. The detection circuit of claim 11, wherein the first input and the second input of the multiplexer are respectively coupled to said first and second output nodes via a respective logic level shifter that is configured to level shift a voltage of the first or second output signals to a logic level appropriate for the multiplexer.

13. The detection circuit of claim 1, wherein:
    the detection circuit comprises a latch configured to generate the detected output pulse at an output of the latch, and
    the latch is coupled to a selected output of the switch, the selected output based on an output of the latch.

14. The detection circuit of claim 13, wherein:
    when the selected output of the switch is the first output signal, then the latch is configured to generate a first edge of the detected output pulse based on the rising edge of the first output signal, and
    when the selected output of the switch is the second output signal, then the latch is configured to generate a second edge of the detected output pulse based on the rising edge of the second output signal.

15. The detection circuit of claim 14, wherein:
the selected output of the switch is the first output signal when the detected output signal is at a low voltage level, and
the selected output of the switch is the second output signal when the detected output signal is at a high voltage level.

16. The detection circuit of claim 1, wherein the gate sense circuit is configured to operate across two different voltage domains, comprising:
a first flying high-voltage domain having a switching reference voltage based on the first voltage and a high voltage based on the second voltage added to the switching reference voltage, voltages at the gate node and the source node of the high-voltage device operating within the first flying high-voltage domain; and
a second low-voltage domain having a fixed reference ground and a fixed high voltage, voltages of the first output signal and the second output signal operating within the second low-voltage domain.

17. The detection circuit of claim 16, wherein the source node of the high-voltage device is coupled to the switching reference voltage and a drain node of the high-voltage device is coupled to the first voltage.

18. A high-voltage switching device, comprising:
a first high-voltage device and a second high-voltage in series connection;
a first detection circuit according to claim 1 and a second detection circuit according to claim 1, a gate node and a source node of each of the first and second high-voltage devices coupled to respective first and second gate sense circuits of said detection circuits; and
a timing control circuit configured to generate timing control signals,
wherein
a drain node of the first high-voltage device is coupled to the first voltage,
a source node of the second high-voltage device is coupled to a reference ground, and
the timing control signals are based on relative timing between an edge of the detected output pulse of the first detection circuit and an edge of the detected output pulse of the second detection circuit.

19. The high-voltage switching device of claim 18, wherein:
the high-voltage switching device is a switch-mode power converter, and
respective gate voltages to the first and second high-voltage devices are based on the timing control signals and configured to generate a deadtime with increased accuracy between an ON state of the first high-voltage device and an ON state of the second high-voltage device.

* * * * *